TEMPERATURE-COMPENSATED DISCRIMINATOR PROVIDING AMPLIFICATION
Filed Nov. 18, 1964
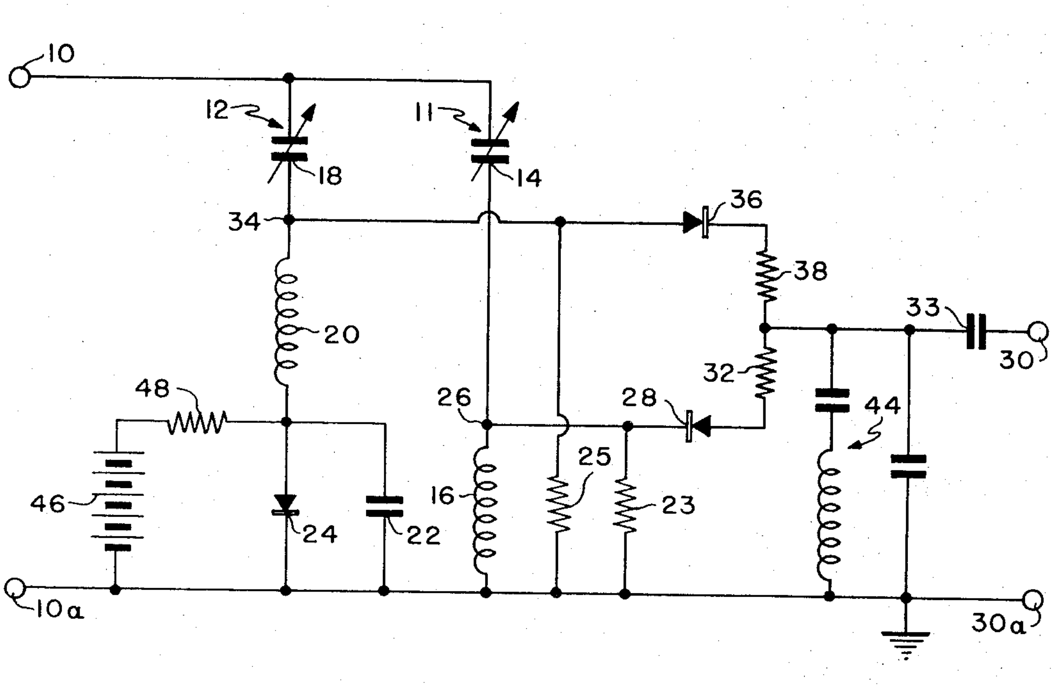
INVENTOR.
JOHN L. DENNIS
BY Alden D. Redfield
Irwin P. Garfinkle
ATTORNEYS.

3,348,158
Patented Oct. 17, 1967

3,348,158

TEMPERATURE-COMPENSATED DISCRIMINATOR PROVIDING AMPLIFICATION

John L. Dennis, Lexington, Ky., assignor to Avco Corporation, Cincinnati, Ohio, a corporation of Delaware Filed Nov. 18, 1964, Ser. No. 412,154
6 Claims. (Cl. 329—141)

ABSTRACT OF THE DISCLOSURE

The disclosure relates to a discriminator. Frequency or phase modulated signals are applied to two series resonant circuits connected in parallel. One of the circuits is tuned slightly above the carrier frequency, while the other is tuned slightly below. The signals derived from the first and second resonant circuits are applied through semiconductor diode detectors to the tuned output circuit. Diode amplification is accomplished in the discriminator by connecting a semiconductor device poled in opposition to the detector diodes and forward biasing each of the diodes.

This invention relates to discriminators in which temperature compensation and voltage gain are automatically provided. More particularly, this invention relates to a discriminator providing low resistance input impedance transformation, voltage gain, automatic temperature compensation, and improved rectification efficiency with lower signal distortion.

The discriminator disclosed provides means for the demodulation of frequency or phase modulated signals. The circuitry includes, in combination, means for power gain through impedance transformation and diode amplification, automatic temperature compensation, and improved linear detection. The circuit functions largely in the manner of the common ratio detector to demodulate frequency or phase modulated signals. However, the circuit additionally provides simple means for amplification, temperature compensation, and impedance transformation.

The primary object of this invention is to provide a discriminator having a low resistance input impedance, impedance transformation with gain in the order of 20 db, and automatic temperature compensation of the active elements and associated circuitry.

For other objects of this invention, reference should be made to the following detailed specification and to the accompanying drawing in which the single figure represents an exemplary embodiment of this invention.

In accordance with the invention, a frequency or phase modulated carrier frequency signal is applied between a signal input terminal 10 and grounded terminal 10*a*. In practice, the carrier frequency signal may be derived from an amplitude limiter in the output of the intermediate frequency stage of a conventional receiver. The modulated carrier frequency signal is applied to two series resonant capacitance-inductance branches 11 and 12 connected in parallel. One branch 11 includes a variable capacitor 14 connected in series with an inductor 16 between terminal 10 and ground. Similarly, the branch 12 includes a variable capacitor 18 connected in series with an inductor 20 between terminal 10 and ground; however, the connection of the inductor 20 to ground is completed through a carrier frequency by-pass capacitor 22 connected across a semiconductor diode 24, the function of which will hereinafter be explained in detail. The inductors 16 and 20 are shunted by resistors 23 and 25, respectively.

The two series branches 11 and 12 are resonant at frequencies appropriately spaced above and below the carrier frequency, the spacings in frequency between the two branches depending on the frequency deviation of the signal. For example, if a 100 kc. spacing is adequate, then one of the branches would be resonant at 50 kc. above the average carrier frequency and the other, 50 kc. below the average carrier frequency.

Signals derived from the junction 26 between the variable capacitor 14 and inductor 16 are used to drive a semiconductor detector 28 connected to output terminal 30 through a low impedance resistor 32 and an alternating current coupling capacitor 33. Signals derived at the junction 34 between variable capacitor 18 and inductor 20 are used to drive a semiconductor detector 36 connected to the output terminal 30 through a resistor 38 and the capacitor 33. A capacitive inductance network 44 provides a low impedance shunt for carrier frequency components. Each of the diodes 24, 28, and 36 is forward biased by means of a battery 46, or other conventional power source, connected through a limiting resistor 48.

When frequency or phase modulated carrier frequencies are applied to terminals 10 and 10*a*, demodulation results, and the demodulated signal intelligence is derived from between output terminals 30 and 30*a* from two parallel branches, each essentially resistive, and including, respectively, the resistor 38, diode 36, and inductor 20, and the resistor 32, diode 28, and inductor 16.

It will be noted that there is a direct current loop for the rectified currents not found in the conventional discriminator. This direct current loop includes the inductor 20, the diode 36, resistors 38 and 32, the diode 28, and the inductor 16, all series connected across the diode 24.

To better understand the operation of the system, assume that the input signal was at a carrier frequency of 11 megacycles and that the branches 11 and 12 were resonant at 50 kc. deviations and that the specific circuit parameters are assumed as follows:

| | | |
|---|---|---|
| Battery **46** | volts | 10 |
| Resistors: | | |
| **23** | kilohms | 820 |
| **25** | do | 820 |
| **32** | do | 10 |
| **38** | do | 10 |
| **48** | megohm | 1 |

Under these assumed conditions an average input impedance of 50 ohms is transformed upwardly to a 5000 ohm impedance, and the frequency modulated carrier input is demodulated with the modulation envelope appearing between the output terminals 30 and 30*a*.

The input signal between terminals 10 and 10*a* looks into two parallel series resonant branches 11 and 12, each being about 80 ohms resistive at resonance and varied upwardly reactively as the frequency varies from its resonance. The instantaneous parallel resistance resultant for the assumed parameters is about 50 ohms. However, the impedance of the inductors 16 and 20 at resonance is about 5000 ohms. Note that the Q of each of the branches 11 and 12 is controlled largely by the resistors 23 and 25 which in the assumed case are 820 kilohms.

The output is derived from between the terminals 30 and 30*a* from two paralleled branches, each essentially 10 kilohms resistive. One branch contains the resistor 38, diode 36, and the inductor 20, and the other contains resistor 32, diode 28, and the inductor 16.

As already noted, there is also established a direct current loop which includes diode 36, resistor 38, resistor 32, diode 28, inductor 16, and inductor 20, all connected across the diode 24. A certain portion of the D-C currents also flows through the resistors 23 and 25, and the magnitude of these currents depends on the state of the diode 24. The diode 24 also governs to a degree the effective impedance in one branch of the output impedance network. Capacitor 22 connected across the diode 24 is made large for the radio frequency components but relatively small for the audio components. Thus diode 24 will be driven negligibly by the input signal but will be driven significantly by the rectified demodulated signal envelope since capacitor 22 is a high impedance at such frequencies.

Consider the static direct current loop including the battery 46 and resistor 48 in series with the diode 24 which in turn is paralleled by the loop effectively containing inductor 20, diode 36, resistor 38, resistor 32, diode 28, and inductor 16. Diode 24, under the conditions previously assumed, draws about 40 microamperes and develops about 0.4 volt, i.e., exhibits about 10 kilohms at normal temperatures. This 0.4 volt feed biases the diodes 36 and 28. A rise in temperature reduces the resistance of the diodes and the voltage drops proportionately since current is limited by the resistor 48. The opposite occurs with a drop in temperature. Therefore, each of the diodes normally biased in the forward direction, changes automatically with temperature to maintain the desired performance as rectifiers.

Next consider the dynamic operation where, for example, the carrier frequency is frequency modulated with a constant amplitude signal. Alternating current signal will flow in the series resonant branches proportional to the instantaneous frequency with respect to the respective resonant frequency of the branches 11 and 12. Branch 11 feeds the negative portion of the signal to the diode 28 and branch 12 feeds the positive portion of the diode 36. Some full wave rectification is achieved proportionately to the respective instantaneous voltages across inductors 20 and 16. The generated unidirectional current flows through the diodes 36 and 28 in series, and the alternating current signal impressed on diodes 36 and 28 is the difference in instantaneous potential across the inductors 20 and 16.

The resultant low frequency envelope tends to flow backward through the diode 24 and alter its running bias. That action changes the instantaneous resistance of the diode 24, and this non-linear characteristic about or near the zero current point of the diode 24 modulates the drive on the diodes 36 and 28 by drawing power from the battery 46 through the resistor 48. The diode 24 may have its resistance changed from the order of megohms to a few ohms. The current from the battery through the diodes 36 and 28 will be altered proportionately. This fluctuation, essentially in phase with the demodulated signal, is superimposed thereon to increase the amplitude of the signal in a manner similar to active signal amplification.

In addition, there is also amplification due to the "reflex" action of the discriminator. The diodes 28 and 36 are normally forward biased to a point where they are both slightly conductive. However, when a signal of sufficient voltage is introduced, the conduction of these diodes suddenly increases, and this increase in current tends to bias off the diode 24 and flow through other branches including the battery 46 and the resistors 23 and 25. The net result is that signal tends to elevate the forward bias of the diodes 28 and 36 to produce a corresponding increase in current. The increased current must flow in the diode loop and elevate the voltage at the junction between resistors 32 and 38. That elevation in voltage represents amplification of the modulation envelope at the output.

While the listed parameters represent a practical circuit, they are not necessarily optimum. The parameters are a design consideration dependent upon the diodes used, and each application should optimize the bias branch for full temperature compensation.

It will be apparent to persons skilled in the art that this invention is susceptible to various modifications and adaptations. It is intended, therefore, that the scope of the invention be limited only by the appended claims as interpreted in the light of the prior art.

What is claimed is:

1. In a discriminator circuit, the combination comprising:

a source of signal modulated carrier frequencies;
a load;
first and second semiconductor devices;
first and second resonant circuits supplied with said signal modulated carrier frequencies for supplying said load through said first and second semiconductor devices, respectively;
means for amplifying said signal, said means comprising a third semiconductor device connected in a series loop including said first and second semiconductor devices, said third semiconductor device being oppositely poled with respect to said first and second semiconductor devices;
and a source of direct currents connected in said loop, said source forwardly biasing each of said devices.

2. The invention as defined in claim 1 wherein a capacitor presenting a high impedance to signal frequencies is connected across said third semiconductor device.

3. A discriminator comprising:

a source of carrier frequencies, frequency modulated with signal;
a first series resonant circuit including a first capacitor and an inductor connected in series, and a second series resonant circuit including a second capacitor and a second inductor connected in series, said first and second circuits being tuned, respectively, above and below said carrier frequency, and being connected across said source;
an output terminal;
a first diode connected between the junction of said first capacitor and inductor and said output terminal;
a second diode connected in series between the junction of said second capacitor and inductor and said output terminal;
a third semiconductor diode, said third semiconductor diode being connected in a direct current series loop including said first inductor, said first diode, said second diode, and said second inductor, said first and second diodes being poled in the same direction for direct currents, and the third diode being oppositely poled with respect thereto;
and biasing means connected in said loop, said biasing means forwardly biasing each of said diodes.

4. The invention as defined in claim 3, and a capacitor connected across said third diode.

5. A discriminator comprising:

a source of carrier frequencies, frequency modulated with signal;
a first series resonant circuit including a first capacitor and an inductor connected in series, and a second series resonant circuit including a second capacitor and a second inductor connected in series, said first and second circuits being tuned, respectively, above and below said carrier frequency, and being connected across said source;
an output terminal;
a first diode connected in series with a resistor between the junction of said first capacitor and inductor and said output terminal;
a second diode connected in series with a second resistor between the junction of said second capacitor and inductor and said output terminal;

a third semiconductor diode, said third semiconductor diode being connected in a direct current series loop including said first inductor, said first diode, said first resistor, said second resistor, said second diode, and said second inductor, said first and second diodes being poled in the same direction for direct currents, and the third diode being oppositely poled with respect thereto;

and biasing means connected in said loop, said biasing means forwardly biasing each of said diodes.

6. The invention as defined in claim 5, and a capacitor connected across said third diode.

References Cited

UNITED STATES PATENTS

| | | | |
|---|---|---|---|
| 2,312,070 | 2/1943 | Bliss | 329—141 |
| 2,873,367 | 2/1959 | Zawek | 329—141 X |
| 3,103,634 | 9/1963 | Nelson et al. | 329—141 X |
| 3,130,372 | 4/1964 | Zajac | 329—130 |

ALFRED L. BRODY, *Primary Examiner.*